United States Patent [19]

Hobby et al.

[11] Patent Number: 5,336,883
[45] Date of Patent: Aug. 9, 1994

[54] OPTICAL FIBER SENSOR FOR PRODUCING A VARIABLE TRANSVERSE STRAIN IN A LOCALIZED PORTION OF THE FIBER

[75] Inventors: James D. Hobby, Didcot; Steven J. Butcher, Kidlington, both of United Kingdom

[73] Assignee: Focas Limited, Swindon, United Kingdom

[21] Appl. No.: 53,736

[22] Filed: Apr. 27, 1993

Related U.S. Application Data

[63] Continuation-in-part of Ser. No. 877,628, May 1, 1992, abandoned.

[30] Foreign Application Priority Data

May 3, 1991 [GB] United Kingdom ............. 9109715.4

[51] Int. Cl.⁵ ..................................... H01J 5/16
[52] U.S. Cl. ................................. 250/227.17; 73/768
[58] Field of Search ................... 250/227.17, 227.21, 250/227.14, 227.16, 227.24; 73/768, 769, 775, 811; 324/244.1, 96

[56] References Cited

U.S. PATENT DOCUMENTS

| | | | |
|---|---|---|---|
| 3,662,263 | 5/1972 | Bensel | 324/96 |
| 4,173,412 | 11/1979 | Ramsay et al. | 250/231.1 |
| 4,321,831 | 3/1982 | Tomlinson et al. | 73/705 |
| 4,368,645 | 1/1983 | Glenn et al. | 73/705 |
| 4,564,289 | 1/1986 | Spillman, Jr. | 356/33 |
| 4,675,522 | 6/1987 | Arunkumar | 324/244.1 |
| 4,753,507 | 6/1988 | DePaula et al. | |
| 4,810,051 | 3/1989 | Kieli | 250/227.21 |
| 5,004,912 | 4/1991 | Martens et al. | 250/227.14 |

FOREIGN PATENT DOCUMENTS

| | | |
|---|---|---|
| 0120999 | 12/1983 | European Pat. Off. |
| 0417848A1 | 9/1990 | European Pat. Off. |
| 2158277A | 4/1984 | United Kingdom |
| 2192289A | 5/1986 | United Kingdom |
| 2208711A | 8/1988 | United Kingdom |
| WO91/13329 | 2/1991 | United Kingdom |

Primary Examiner—David C. Nelms
Assistant Examiner—Que T. Le
Attorney, Agent, or Firm—Westman, Champlin & Kelly

[57] ABSTRACT

A sensor assembly 1 comprises an optical fibre 4 and a transducer 23 arranged to apply transverse strain to a localised portion 24 of the fibre. Birefringence effects induced by the fibre strain are remotely sensed to obtain a signal representative of the transducer input which in turn is connected to a current sensing coil 34 thereby enabling electric current in a conductor 32 to be remotely sensed. The localised portion 24 of the fibre 4 is stripped to remove an outer jacket and is embedded in a relatively rigid matrix material. Damage to the fibre and the effects of creep are thereby avoided. The resulting sensor is particularly suited to the measurement of high currents in power distribution systems.

23 Claims, 3 Drawing Sheets

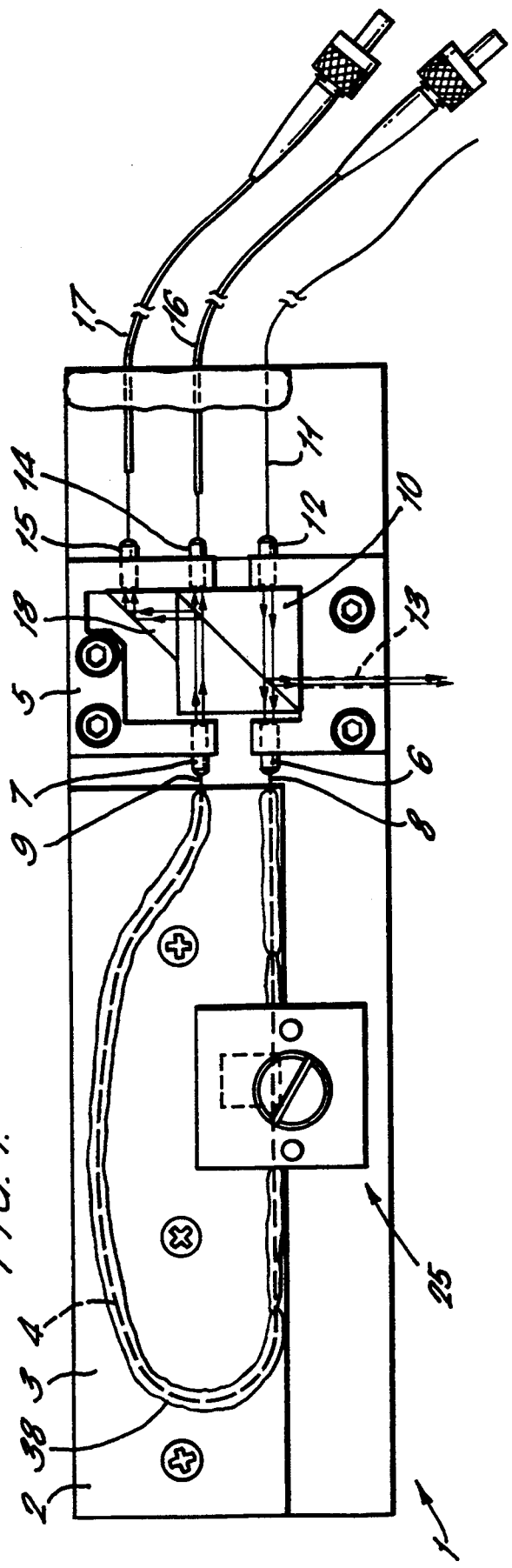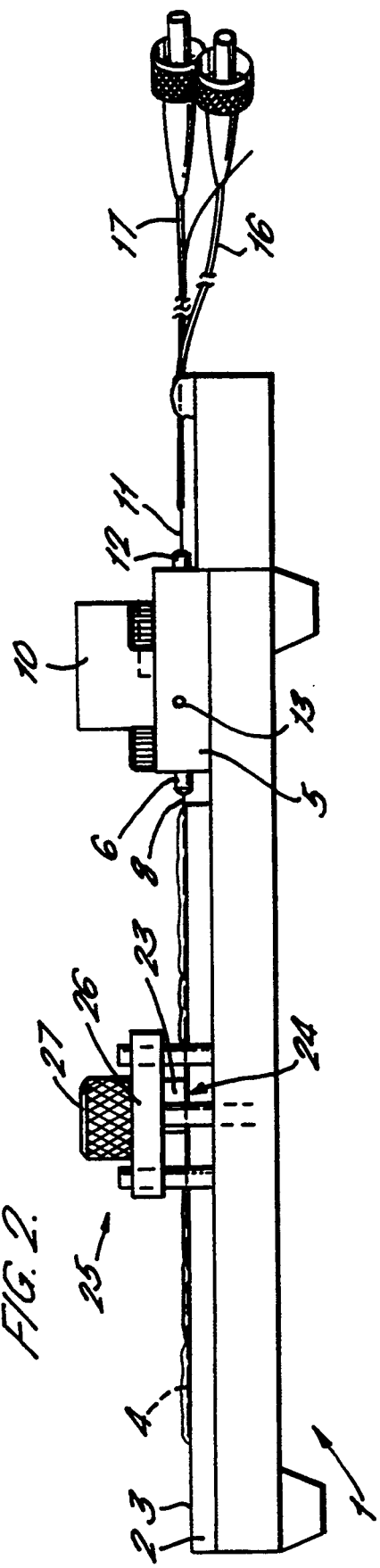

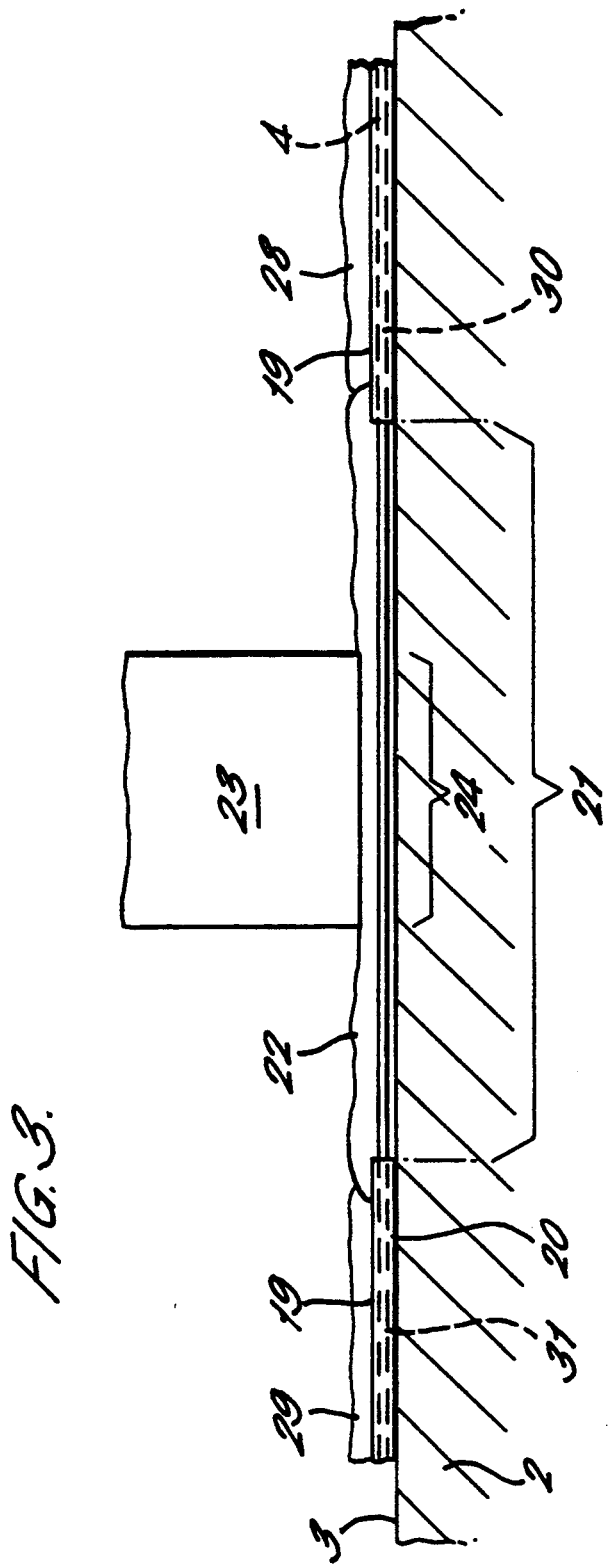

OPTICAL FIBER SENSOR FOR PRODUCING A VARIABLE TRANSVERSE STRAIN IN A LOCALIZED PORTION OF THE FIBER

This is a continuation-in-part application from U.S. Ser. No. 07/877,628 filed May 1, 1992 which now abandoned application is entirely incorporated herein by reference.

BACKGROUND OF THE INVENTION

This invention relates to fibre optic sensors and in particular but not exclusively to sensors for remotely measuring electric current.

It is known from U.S. Pat. No. 4,173,412 to utilise birefringence effects to measure transverse strain in a single mode optical fibre wound around an expanding mandrel by observing the change in polarisation state of light transmitted through the fibre. Such birefringence effects can be detected in several ways but typically light with a fixed polarisation state is input to the fibre and the output is analysed using a polarising beam splitter producing components with mutually orthogonal polarisation. The relative amplitudes of the components are processed to provide an output representative of the value of strain.

It is also known to provide transducers responsive to various physical parameters and operable to apply stress to the fibre thereby enabling the value of the parameter to be remotely sensed by observing the resulting strain in the fibre.

Sensors in which fibres are found around a mandrel have several disadvantages. Winding the coil must be done with great care since the fibre will break if wound to less than a minimum bend radius, typically several millimeters, and this also limits the extent to which such sensors may be miniaturised.

A further disadvantage is that in winding the fibre into a coil the fibre is placed in a helically sprung state in which the fibre is both transversely and longitudinally strained thereby inducing a background level of birefringence which tends to vary with age due to creep effects. The background level also tends to be unpredictable in magnitude from one winding to another such that the sensors are inherently non-reproducible.

A further disadvantage results from longitudinal strain being applied to the fibre in addition to transverse strain thereby complicating the nature of the birefringence effect produced whereas for simplicity, predictability and linearity in the observed effects it is preferable for a short linear length of fibre to be transversely strained.

It is also known from U.S. Pat. No. 4,753,507 to apply transverse strain to a fibre by means of a transducer provided with jaws which grip and compress the fibre. Such arrangements tend to damage the fibre and introduce a phase lag between transducer movement and fibre strain due to deformation of the outer jacket material of the fibre.

It is also known from GB-A-2208711 to provide a sensor in which the fibre is embedded in a body formed of an active matrix material which is inherently responsive to an external physical parameter so as to change shape and thereby apply stress to the fibre. Such sensors similarly have the disadvantages of non-reproduceability and of applying both longitudinal and transverse stresses to the fibre. Varying effects are also experienced along the length of the fibre thereby producing cummulatively a complex birefringence effect.

OBJECTS OF THE PRESENT INVENTION

It is an object of the present invention to provide a sensor in which an optical fibre transversely strained by a transducer remains undamaged by forces applied to the fibre.

It is a further object to provide a sensor in which the birefringence effects are substantially unaffected by creep occuring in the fibre in use.

It is a further object to provide a sensor which is simple to manufacture and which has predetermined characteristics which are inherently reproducible.

It is a further object to provide a sensor in which the fibre is not susceptible to longitudinal strain and in which longitudinal creep effects have substantially no effect on the operation of the sensor.

It is a further object of the present invention to provide a method of sensing a physical parameter by a fibre optic sensor in which the effects of vibration on the sensor are minimal.

It is a further object of the present invention to provide a method of forming a sensor which avoids damage to the fibre and which applies only transverse strain in a controlled manner to a localised portion of the fibre.

It is a further object to provide a sensor in which an optical fibre is transversely strained in a manner which avoids any phase lag between movement of the transducer and strain in the fibre.

According to the present invention there is disclosed a sensor comprising an optical fibre and a transducer operable to produce a variable transverse strain in a localised portion of the fibre in a manner respresentative of the value of a physical parameter to be sensed whereby in use light transmitted through the fibre undergoes a change of polarisation state which is detectable to obtain an output representative of the parameter, the fibre comprising an inner core encased by a cladding layer of different refractive index from that of the core and an outer jacket of relatively deformable material, wherein the localised portion of the fibre does not include the jacket but is embedded in a first body of a relatively rigid first matrix material and the transducer is cooperable with the first body so as to produce strain in the localised portion of the fibre by applying stress to the first body.

An advantage of such a sensor is that a purely transverse stress can be applied to a fibre such that only a very localised portion of fibre exhibits birefringence. This arrangement is inherently reproducible. A further advantage is that the localised portion of fibre is protected by the presence of the rigid matrix material from damage which might otherwise result from applying transverse stress. The absence of the jacket from the localised portion of fibre also ensures that the effect of transducer movement is immediately and directly communicated to the fibre. If the jacket were present, the resilience of the jacket material would tend to result in a phase lag between transducer movement and the stress being applied to the fibre.

Preferably the first matrix material comprises an epoxy resin.

Preferably adjacent portions of the fibre projecting from the first body adjacent to the localised portion are embedded in respective second and third bodies of a relatively resilient second matrix material.

The second matrix material may conveniently be an elastomer.

Preferably the localised portion extends linearly.

By making the localised portion a short linear length of fibre which is stressed transversely, any longitudinal creep of the fibre will have substantially no effect on the transverse strain in the fibre and hence will make no contribution to the birefringence effect.

Conveniently the fibre comprises an output end which in use receives light transmitted through the localised portion and wherein the fibre includes at least one curved portion intermediate the localised portion and the output end.

The curved portion serves to act as a cladding mode stripper, i.e. to remove unwanted modes transmitted in the cladding.

The fibre typically is a single mode fibre having a silica core and a doped silica cladding with a jacket formed of acrylate.

Preferably the transducer comprises sensing means responsive to the sensed parameter and an actuator operable to apply stress to the first body in response to the output of the sensing device.

Conveniently this sensor comprises a rigid substrate to which the localised portion is secured by the first body and a clamp operable between the actuator and the substrate to apply a clamping force compressing the first body therebetween.

Conveniently the clamp comprises adjustment means operable to adjust the clamping force.

Such adjustment is useful in setting up the sensor and may also be utilised to compensate for transverse creep in the fibre.

Conveniently the fibre has an input end coupled to a polarising device mounted on the substrate and operable to conduct light of constant polarisation state into the fibre.

Conveniently the fibre has an output end coupled to a polarising beam splitter mounted on the substrate and operable to split light emergent from the output end into components having mutually orthogonal planes of polarisation.

The actuator may comprise an electrostrictive device.

Such electrostrictive devices exhibit the useful characteristic of delivering a mechanical movement at double the frequency of an exciting electrical input.

The sensing means may be a sensing device responsive to electric current in a conductor whereby the sensed parameter constitutes the value of electric current.

According to the present invention there is also disclosed a method of sensing a physical parameter comprising the steps of transmitting light through an optical fibre, operating a transducer to produce a variable transverse strain in a localised portion of the fibre in a manner representative of the value of the physical parameter and detecting a change in polarisation state in the transmitted light to obtain an output representative of the parameter, the fibre comprising an inner core encased by a cladding layer of different refractive index from that of the core and an outer jacket of relatively deformable material, wherein the transducer is operated so as to apply stress to a first body of a relatively rigid first matrix material in which the localised portion is embedded without including the jacket to thereby produce strain in the localised portion.

According to a further aspect of the present invention there is disclosed a method of forming a sensor from an optical fibre having an inner core encased by a cladding layer of different refractive index from that of the core and an outer jacket of relatively deformable material, the method including the steps of removing the jacket from a localised portion of the fibre, embedding the localised portion in a first body of a relatively rigid first matrix material and operatively coupling an actuator of the transducer to the first body such that the actuator is operable to produce a variable transverse strain in the localised portion in a manner representative of the value of a physical parameter to be sensed whereby in use light transmitted through the fibre undergoes a change of polarisation state which is detectable to produce an output representative of the parameter.

DESCRIPTION OF PREFERRED EMBODIMENTS

Figure 4:
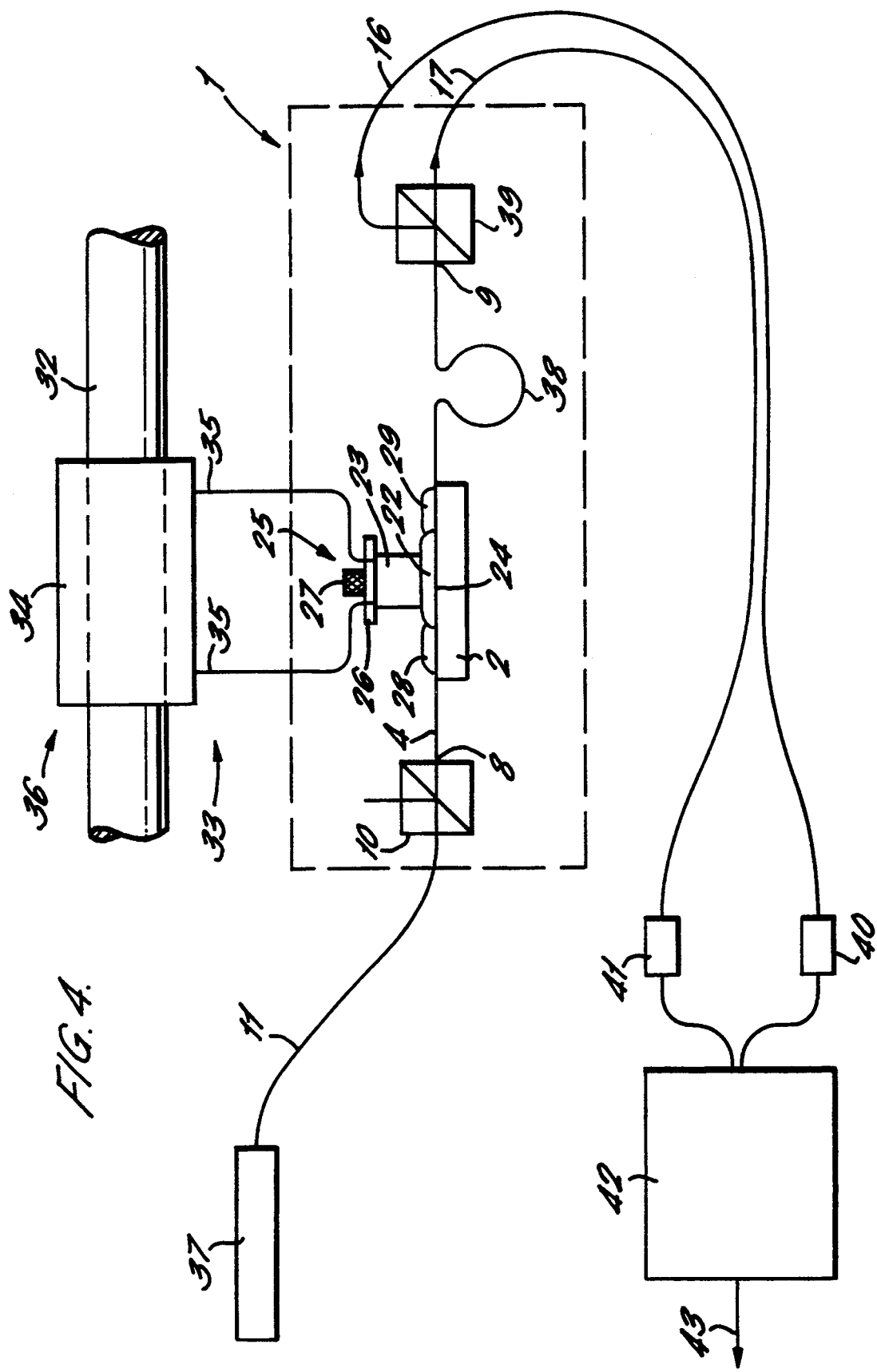

Preferred embodiments of the present invention will now be described by way of example only and with reference to the accompanying drawings of which FIG. 1 is a schematic plan view of a sensor in accordance with the present invention, FIG. 2 is a side elevation of the sensor of FIG. 1, FIG. 3 is an enlarged schematic side elevation, not to scale, of part of the sensor of FIGS. 1 and 2 showing the localised portion of fibre, and FIG. 4 is a schematic diagram showing the sensor in use to measure electric current.

As shown in FIGS. 1 and 2 a sensor assembly 1 comprises a steel substrate 2 defining a planar upper surface 3 traversed by an optical fibre 4. A housing 5 projects upwardly of the substrate 2 and serves to mount first and second lenses 6 and 7 to which are coupled input and output ends 8 and 9 respectively of the fibre 4.

The housing 5 also houses a polarising beam splitter 10 arranged to receive linearly polarised light via a polarisation maintaining fibre 11 from a remote source (not shown) of linearly polarised light, the fibre 11 terminating in a third lens 12 arranged to collimate the light before entry to the beam splitter 10.

Light transmitted linearly through the beam splitter 10 into the fibre 4 has a precisely defined angle of polarisation, unwanted components being deflected through 90° by the beam splitter to emerge from a side port 13 in the housing 5. In this context therefore the beam splitter is used as a polarising device.

The first lens 6 acts as a collecting lens to channel transmitted light into the fibre 4.

The beam splitter 10 also serves as an output beam splitter operable to analyse the light emitted from the output end 9 of fibre 4 into components having mutually orthogonal polarisation angles, the components being directed via fourth and fifth lenses 14 and 15 respectively into first and second output fibres 16 and 17 respectively.

A prismatic reflector 18 is mounted in conjunction with the beam splitter 10 to enable the fourth and fifth lenses 14 and 15 to be located in side by side relationship with the third lens 12.

The fibre 4 is a single mode fibre having a silica core of circular cross section surrounded by a doped silica cladding layer. As shown in FIG. 3 an acrylate jacket 19 covers the cladding 20 over most of the length of fibre 4, this being the conventional construction of such fibres. A stripped portion 21 of the fibre 4 however does not include the jacket 19 and is embedded in a first body 22 of a first matrix material i.e. an epoxy resin selected for its qualities of stiffness and lack of creep. The stripped portion 21 is thereby bonded to the upper surface 3 of the substrate 2 so as to extend linearly over the surface.

An electrostrictive actuator 23 is mounted in contact with the first body 22 so as to overlay a localised portion 24 of the stripped portion 21 of fibre 4 as shown in FIG. 3 such that any movement of the actuator 23 towards or away from the surface 3 will be communicated to the localised portion.

An adjustable clamp 25 mounted on the substrate 2 has a clamping plate 26 overlaying the actuator 23 and is adjustable by means of a threaded adjuster 27 to apply a clamping force to the actuator such that the first body 22 and hence the localised portion 24 are compressed between the actuator 23 and the substrate 2.

As seen in FIG. 3 the first body 22 overlays the full longitudinal extent of the stripped portion 21 and the remainder of the fibre 4 is then embedded in a second matrix material shown as second and third bodies 28 and 29 respectively which bond to the substrate 2 portions 30 and 31 which project from the first body 22 adjacent to the localised portion 24.

The second matrix material is a relatively soft and resilient elastomeric material which holds in place the fibre 4 while absorbing any shock and vibration to which the sensor assembly 1 is subjected. The second matrix material thereby contributes to immunity from external vibration effects in the fibre 4.

In FIG. 3 the relative sizes of the fibre and the thickness of the bodies 22, 28 and 29 are exaggerated for clarity.

The manner in which the sensor assembly 1 is utilised is illustrated in FIG. 4 where electrical current flowing in a conductor 32 is to be measured. Reference numerals corresponding to those of preceding figures are used where appropriate for corresponding elements. The sensor assembly 1 comprises a transducer 33 which consists of a current sensing device in the form of a Rogowski coil 34 fitted to the conductor 32 and an electrostrictive actuator 23 connected to the coil by wires 35.

The sensor assembly 1 and the coil 34 together constitute a sensor 36 in accordance with the present invention. Linearly polarised light from a laser light source 37 is directed through a polarisation maintaining fibre 11 of the bow tie type to a polarising beam splitter 10 which transmits light of a selected polarisation angle into fibre 4 of the sensor assembly 1. The fibre 4 is clamped as described above with reference to FIG. 3 in a clamp 25 such that the actuator 23 is biased towards substrate 2 with a clamping force determined by the position of adjuster 27 thereby applying a controllable background level of stress to the fibre 4 located within first body 22.

The fibre 4 includes a curved portion 38 intermediate the localised portion 24 and the output end 9 and this functions as a cladding mode stripper in order to eliminate unwanted modes from the transmitted light received at the output end 9.

The output end 9 is connected to a polarising beam splitter 39 which analyses the transmitted light into X and Y components having mutually orthogonal polarisation states and which are separately conducted via first and second output fibres 16 and 17 respectively to remotely located detectors 40 and 41 respectively. The detectors 40, 41 measure the amplitude of the X and Y components and input corresponding signals to a processor 42 which compares the amplitudes of the X and Y components to produce an output 43 dependent on their relative amplitude.

In setting up the sensor assembly 1 the adjuster 27 is turned to a position in which the resulting clamping force is sufficient to provide a background level of birefringence such that the X and Y components have substantially equal magnitude. Positive and negative perturbations to the strain experienced by the fibre 4 are thereby made detectable by positive and negative perturbations to the relative amplitude of the X and Y components as measured in the output 43.

An alternating current in the conductor 32 is detectable as a signal in the wires 35 at the frequency of modulation of the current. The electrostrictive actuator 23 responds to this input by mechanical deformation at twice the frequency of the input signal received from via wires 35 and a corresponding strain is experienced in the localised portion 24 of the fibre 4. The output 43 will therefore exhibit a modulation at $2f$ where f is the frequency of modulation of current 32 and the amplitude of modulation of the output 43 is representative of the amplitude of modulation of the current in conductor 32.

In the above described preferred embodiment the epoxy resin is formed by mixing contituents A and B defined as follows. Constituent A consists of 1,4 Butanediol diglycioylether, DER 351 and A187 in relative proportions 10:90:1 respectively by weight. Constituent B consists of IPD with relative weight 35.

DER 351 is a non crystalizing mixture of bisphenol A diglycioylether and bisphenol F diglycioylether ethers available from Dow Chemical Co.

A 187 comprises organo functionalized silane available from Union Carbide.

IPD comprises isophorone diamine available from HULS.

The epoxy resin is cured by heating to 80° C. for a period of one hour.

In the preferred embodiment disclosed above the fibre 4 has a core of circular cross-section of diameter 4 micrometers and a cladding of doped silica having a diameter of 125 micrometers. The light source 37 is a helium neon laser providing light at 633 nanometers, the above dimensions of fibre 4 being selected to provide single mode operation at this operating wavelength. The length of the localised portion 24 is 1 centimeter and the total length of the fibre 4 between input and output ends 8 and 9 is 20 centimeters.

The output fibres 16 and 17 are standard multi-mode fibres.

The method of assembling the sensor assembly 1 includes the step of stripping the jacket 19 to form the stripped portion 21 by dipping the fibre 4 in acetone to dissolve the acrylate jacket material.

The fibre 4 is then bonded to the substrate 2 with a quantity of the epoxy resin selectively overlaying the stripped portion 21 and adjacent portions 30, 31 of the fibre. The procedure for bonding the fibre 4 to the substrate 2 is to apply a thin strip of epoxy resin in its uncured state to the substrate 2, place the fibre onto the strip of resin such that it sinks into the resin and to then allow the resin to cure into solid form. As shown in FIG. 1 the stripped portion 21 of the fibre as a result of this procedure is encased in resin without actual contact with the substrate 2. This has the advantage of avoiding problems associated with an irregularities in the substrate surface which could apply localised strain irregularities to the fibre when clamped. The remainder of the fibre 4 is then bonded to the substrate 2 using an elastomeric resin.

The actuator 23 is then placed on the first body 22 of solidified resin and the clamp 25 fitted and adjusted to provide the required clamping force.

For an initial period of 48 hours, the clamp 25 is adjusted to apply about 90% of the required clamping force to the fibre. During this period some creep of the fibre material would be expected to occur. Following this initial period, the clamp 25 is adjusted to provide the full required clamping force. The presence of such creep is detectable by a change in the steady state level of the output 43. The effects of creep can be cancelled by adjusting the clamping force by means of the adjuster 27 such that the original relative amplitude of the X and Y components is restored.

The sensor 36 is however substantially unaffected by any tendency of the fibre 4 to creep longitudinally.

It has been found that creep in the transverse direction does not occur to any significant extent after the initial settling in period so that readjustment should not be expected to be necessary during continued use.

The sensor assembly 1 may be encapsulated within an external structure (not shown) which may be filled with a suitable encapsulating medium such as inert gel or an inert gas.

The use of an electrostrictive actuator has the advantage of frequency separation between the characteristic frequency of modulation of the parameter being sensed and the modulation frequency of the birefrigence effects. Any vibration effects produced in the fibre other than by action of the actuator may thereby be filtered out by suitable processing in the processor 42.

Alternative actuators may be utilised such as piezoelectric actuators. It is also envisaged that in some applications the actuator and parameter sensing device may be integrally formed as in the case of a magnetostrictive device in which the actuator is itself responsive to changes in magnetic field and where the magnetic field is the observed parameter.

In the preferred embodiment a laser light source is utilised and may for example be a helium neon laser or a solid state laser. Alternative forms of laser may be utilised or alternatively it may also be possible to use light sources other than lasers if they provide polarised light of narrow band width.

The present invention has particular application to the measurement of current in power transmission lines where characteristically high currents or voltages are encountered. The sensor assembly is extremely rugged in construction and is therefore suited to withstand the large transient currents and voltages with their associated mechanical shock which are experienced under fault conditions in such power transmission lines.

Throughout the above disclosure the term "stress" is used in accordance with its usual meaning to denote a deforming force per unit area and the term "strain" to denote the resulting fractional change in dimensions. Stress and strain are generally linearly related for a given material, the ratio of stress to strain being characterised by Young's Modulus.

The sensor assembly of the above example may be modified by the addition of an additional actuator acting on the optical fibre 4 and acting in the same direction. The actuator may be of a different type selected such that the result of driving the actuator with a voltage at frequency f produces a mechanical output at the same frequency f whereas the electrostrictive actuator is producing an effect at frequency $2f$. A piezoelectric transducer for example would achieve this result. If both actuators are then driven from the same source then the output at the processor 42 will contain components at both f and $2f$. Suitable signal processing may then be used to reduce the effects of frequency dependent noise on the output signal.

The two actuators may alternatively be driven from different sources in order to simultaneoulsy measure two different parameter values.

In the above described embodiment a Rogowski coil is utilised as a current sensing device. Other devices may alternatively be used including coil devices which are other than Rogowski coils. Parameters other than electric current may also be sensed using appropriate alternative sensing devices providing electrical signals to the actuator 23.

In the above example the fibre 11 is referred to as being of the bow tie type. Other forms of polarisation maintaining fibre may alternatively be utilised.

The substrate material may be other than steel provided it exhibits stability and rigidity.

We claim:

1. A sensor comprising an optical fibre and a transducer operable to produce a variable transverse strain in a localised portion of the fibre in a manner respresentative of the value of a physical parameter to be sensed whereby in use light transmitted through the fibre undergoes a change of polarisation state which is detectable to obtain an output representative of the parameter, the fibre comprising an inner core encased by a cladding layer of different refractive index from that of the core and an outer jacket of relatively deformable material, wherein the localised portion of the fibre does not include the jacket but is embedded in a first body of a relatively rigid first matrix material and the transducer is cooperable with the first body so as to produce strain in the localised portion of the fibre by applying stress to the first body.

2. A sensor as claimed in claim 1 wherein the first matrix material comprises an epoxy resin.

3. A sensor as claimed in claim 1 wherein adjacent portions of the fibre projecting from the first body adjacent to the localised portion are embedded in respective second and third bodies of a relatively resilient second matrix material.

4. A sensor as claimed in claim 3 wherein the second matrix material is an elastomer.

5. A sensor as claimed in claim 1 wherein the localised portion extends linearly.

6. A sensor as claimed in claim 1 wherein the fibre comprises an output end which in use receives light transmitted through the localised portion and wherein the fibre includes at least one curved portion intermediate the localised portion and the output end.

7. A sensor as claimed in claim 1 wherein the fibre is a single mode fibre having a silica core and a doped silica cladding.

8. A sensor as claimed in claim 7 wherein the jacket is formed of acrylate.

9. A sensor as claimed in claim 1 wherein the transducer comprises sensing means responsive to the sensed parameter and an actuator operable to apply stress to the first body in response to the output of the sensing device.

10. A sensor as claimed in claim 9 comprising a rigid substrate to which the localised portion is secured by the first body and a clamp operable between the actuator and the substrate to apply a clamping force compressing the first body therebetween.

11. A sensor as claimed in claim 10 wherein the clamp comprises adjustment means operable to adjust the clamping force.

12. A sensor as claimed in claim 10 wherein the fibre has an input end coupled to a polarising device mounted on the substrate and operable to conduct light of constant polarisation state into the fibre.

13. A sensor as claimed in claim 10 wherein the fibre has an output end coupled to a polarising beam splitter mounted on the substrate and operable to split light emergent from the output end into components having mutually orthogonal planes of polarisation.

14. A sensor as claimed in claim 9 wherein the actuator comprises an electrostrictive device.

15. A sensor as claimed in claim 9 wherein the sensing means is a sensing device responsive to electric current in a conductor whereby the sensed parameter constitutes the value of electric current.

16. A method of sensing a physical parameter comprising the steps of transmitting light through an optical fibre, operating a transducer to produce a variable transverse strain in a localised portion of the fibre in a manner representative of the value of the physical parameter and detecting a change in polarisation state in the transmitted light to obtain an output representative of the parameter, the fibre comprising an inner core encased by a cladding layer of different refractive index from that of the core and an outer jacket of relatively deformable material, wherein the transducer is operated so as to apply stress to a first body of a relatively rigid first matrix material in which the localised portion is embedded without including the jacket to thereby produce strain in the localised portion.

17. A method as claimed in claim 16 including the step of conducting light of constant polarisation state into an input end of the fibre via a polarising device formed integrally with the sensor.

18. A method as claimed in claim 16 including the step of splitting light emergent from an output end of the fibre into components having mutually orthogonal planes of polarisation and transmitting the respective components to a receiver.

19. A method as claimed in claim 16 including the step of conducting light transmitted through the localised portion to an output end of the fibre via a curved portion of the fibre.

20. A method of forming a sensor from an optical fibre having an inner core encased by a cladding layer of different refractive index from that of the core and an outer jacket of relatively deformable material, the method including the steps of removing the jacket from a localised portion of the fibre, embedding the localised portion in a first body of a relatively rigid first matrix material and operatively coupling an actuator of the transducer to the first body such that the actuator is operable to produce a variable transverse strain in the localised portion in a manner representative of the value of a physical parameter to be sensed whereby in use light transmitted through the fibre undergoes a change of polarisation state which is detectable to produce an output representative of the parameter.

21. A method as claimed in claim 20 including the step of embedding adjacent portions of the fibre located adjacent to the localised portion in respective second and third bodies of a relatively resilient second matrix material.

22. A method as claimed in claim 21 including the step of securing the first, second and third bodies to a rigid substrate.

23. A method as claimed in claim 21 including the step of clamping the actuator relative to the substrate such that a clamping force is continuously applied to the first body via the actuator.

* * * * *